United States Patent
Narusawa

(10) Patent No.: US 9,660,018 B2
(45) Date of Patent: May 23, 2017

(54) SEMICONDUCTOR DEVICE FABRICATING METHOD AND SEMICONDUCTOR DEVICE

(71) Applicant: LAPIS SEMICONDUCTOR CO., LTD., Kanagawa (JP)

(72) Inventor: Takuo Narusawa, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/743,588

(22) Filed: Jun. 18, 2015

(65) Prior Publication Data

US 2015/0380479 A1  Dec. 31, 2015

(30) Foreign Application Priority Data

Jun. 26, 2014 (JP) ................................. 2014-131752

(51) Int. Cl.
*H01L 49/02* (2006.01)
(52) U.S. Cl.
CPC .................................... *H01L 28/75* (2013.01)
(58) Field of Classification Search
CPC ... H01L 21/20; H01L 21/32139; H01L 28/60; H01L 21/76802; H01L 21/76808; H01L 23/5223; H01L 28/91; H01L 27/1085; H01L 27/10897; H01L 2924/0002; H01L 2924/00; H01L 27/0805; H01L 28/75; H01L 49/02
See application file for complete search history.

(56) References Cited

U.S. PATENT DOCUMENTS

| 2005/0170583 A1* | 8/2005 | Park | H01L 21/76802 438/253 |
| 2007/0293014 A1* | 12/2007 | Kim | H01L 21/32139 438/381 |
| 2011/0210422 A1* | 9/2011 | Imamura | H01L 23/5223 257/532 |

FOREIGN PATENT DOCUMENTS

JP  2013-191764 A  9/2013

* cited by examiner

*Primary Examiner* — Fernando L Toledo
*Assistant Examiner* — Lawrence-Linh T Nguyen
(74) *Attorney, Agent, or Firm* — Volentine & Whitt, PLLC

(57) ABSTRACT

A method of fabricating a semiconductor device, including forming a lower electrode on a substrate; forming a first insulating film covering a periphery of the lower electrode and an upper surface end portion of the lower electrode; forming a second insulating film along an upper surface central portion outside the upper surface end portion of the lower electrode and a side surface and an upper surface of the first insulating film; and forming an upper electrode on the second insulating film.

6 Claims, 15 Drawing Sheets

SEMICONDUCTOR DEVICE FABRICATING METHOD AND SEMICONDUCTOR DEVICE

CROSS-REFERENCE TO RELATED APPLICATION

This application is based on and claims priority under 35 USC 119 from Japanese Patent Application No. 2014-131752 filed on Jun. 26, 2014, the disclosure of which is incorporated by reference herein.

BACKGROUND

Technical Field

The present invention relates to a semiconductor device fabricating method and a semiconductor device.

Related Art

Metal-insulator-metal (MIM) capacitors are known as capacitor elements in semiconductor devices. FIGS. 7A to 7E are sectional views schematically showing a process by which a semiconductor device 90 including a MIM capacitor C pertaining to related art is fabricated (Japanese Patent Application Laid-open (JP-A) No. 2013-191764).

When forming the MIM capacitor C, as shown in FIG. 7A, an interlayer insulating film 301 is formed on a semiconductor substrate 300. Thereafter, a Ti/TiN/Al/Ti film (a multilayer film comprising a titanium (Ti) film 302a, a titanium nitride (TiN) film 302b, an aluminum (Al) film 302c, and a titanium (Ti) film 302d that have been sequentially layered on top of one another from the bottom) that is a lower electrode 302 is formed using sputtering, for example.

Next, a silicon oxynitride (SiON) film that is an insulating film 303 is formed on the lower electrode 302 using chemical vapor deposition (CVD). The insulating film 303 configures a capacitor insulating film in the MIM capacitor C, and the film thickness of the insulating film 303 is set in accordance with, for example, the capacitance of the MIM capacitor C. Next, as shown in FIG. 7B, a TiN film serving as an upper electrode 304 is formed on the insulating film 303 using sputtering.

Next, as shown in FIG. 7C, patterning of the upper electrode 304 is performed using lithography and dry etching. In this patterning, the section of the upper electrode 304 outside the region in which the MIM capacitor C is to be formed (a MIM capacitor formation region 330) is removed, but because the insulating film 303 is left, the lower electrode 302 is not etched.

Here, if the insulating film 303 is not left and the lower electrode 302 is exposed, reaction products that occur during the dry etching stick to the side wall section of the MIM capacitor formation region 303 and lead to a poor breakdown voltage. For that reason, it is preferred that the insulating film 303 be left.

Next, as shown in FIG. 7D, an insulating film 305 that becomes part of an antireflection film in a lithography step when processing the lower electrode 302 described below is formed on the total surface of the insulating film 303. In this related art, a SiON film, which is to say the same type of film as the insulating film 303, is used as the insulating film 305. Consequently, in the region outside the MIM capacitor formation region 330, the insulating film has a multilayer structure comprising the insulating film 303 and the insulating film 305.

Next, as shown in FIG. 7D, the lower electrode 302 is patterned using lithography and dry etching. The multilayer structure, comprising the SiON film serving as the insulating film 305 and the SiON film serving as the insulating film 303, acts as an antireflection film in an exposure step in this lithography.

Next, as shown in FIG. 7E, an interlayer insulating film 306 (in this related art, a silicon oxide (SiO$_2$) film) is formed, and thereafter vias 322, plugs 307 that plug the vias 322, and upper wires 308 that are electrically connected to the plugs 307 are formed.

Through the above process, the MIM capacitor C, which has a structure wherein the insulating film 303 (SiON film) that is the capacitor insulating film is sandwiched between the lower electrode 302 and the upper electrode 304 that are two electrodes, is formed.

In the semiconductor device fabricating process disclosed in JP-A No. 2013-191764, the insulating film 303 that is the capacitor insulating film and the insulating film 305 that is the antireflection film are each formed by a SiON film.

The relative permittivity of a SiON film is relatively low, and when a SiON film is used as the insulating film 303 that is the capacitor insulating film, it is necessary to make the film thickness of the SiON film thinner in order to increase the capacitance of the MIM capacitor C. However, when the insulating film 303 is made thinner, it becomes easier for the problem of a poor breakdown voltage to occur.

At the same time, the reflectance of the SiON film used as the insulating film 305 that is the antireflection film is highly dependent on film thickness, and is necessary to manage the film thickness to a predetermined value. Moreover, as mentioned above, in the region outside the MIM capacitor formation region 330, the antireflection film has a multilayer structure comprising the insulating film 305 and the insulating film 303, so it becomes necessary to consider both capacitance and reflectance, and managing the film thickness becomes even more difficult.

As described above, in the related art using SiON films as the insulating film of the capacitor insulating film and the insulating film of the antireflection film, there is a tradeoff between the capacitance of the MIM capacitor C and the breakdown voltage, so it becomes difficult to satisfy both functions, and furthermore managing the film thickness of both insulating films also becomes difficult.

On the other hand, if a SiN (silicon nitride) film, which has a higher relative permittivity than a SiON film, is used as the capacitor insulating film from the standpoint of increasing the capacitance of the MIM capacitor C, it becomes easier to achieve a balance between the capacitance of the MIM capacitor C and the breakdown voltage.

However, in this case it becomes necessary to form on the SiN film a separate SiON film to serve as an antireflection film because the SiN film transmits the light used in the exposure step. For that reason, the antireflection film comes to have a two-layer structure comprising the SiN film and the SiON film layered thereon, the film that must be patterned increases, and its function as an antireflection film drops, so the patterning of the lower electrode 302 ends up becoming difficult.

SUMMARY

The present invention has been made in order to address the aforementioned problem, and it is an object thereof to provide a semiconductor device fabricating method and a semiconductor device with which capacitance is increased and a degradation of the breakdown voltage is controlled.

A first aspect of the present invention provides a method of fabricating a semiconductor device, the method including:

forming a lower electrode on a substrate;

forming a first insulating film covering a periphery of the lower electrode and an upper surface end portion of the lower electrode;

forming a second insulating film along an upper surface central portion outside the upper surface end portion of the lower electrode and a side surface and an upper surface of the first insulating film; and forming an upper electrode on the second insulating film.

A second aspect of the present invention provides a semiconductor device including:

a lower electrode that is disposed on a substrate;

a first insulating film that is disposed on the lower electrode and in which the thickness of its end portion is made thicker than the thickness of its central portion outside the end portion;

an upper electrode that is disposed along the central portion and the end portion of the first insulating film;

a second insulating film that covers the lower electrode, the first insulating film, and the upper electrode;

a first conductive portion that is formed in an open portion, which runs through the second insulating film and exposes the upper electrode, and is electrically connected to the upper electrode; and a second conductive portion that is formed in an open portion, which runs through the second insulating film and exposes the lower electrode, and is electrically connected to the lower electrode.

According to the present invention, it becomes possible to provide a semiconductor device fabricating method and a semiconductor device with which capacitance is increased and a degradation of the breakdown voltage is controlled.

BRIEF DESCRIPTION OF THE DRAWINGS

Exemplary embodiments of the present invention will be described in detail based on the following figures, wherein.

DETAILED DESCRIPTION

[First Embodiment]

A semiconductor device fabricating method and a semiconductor device pertaining to a first embodiment will now be described with reference to FIG. 1 and FIGS. 2A to 2J.

Figure 1:
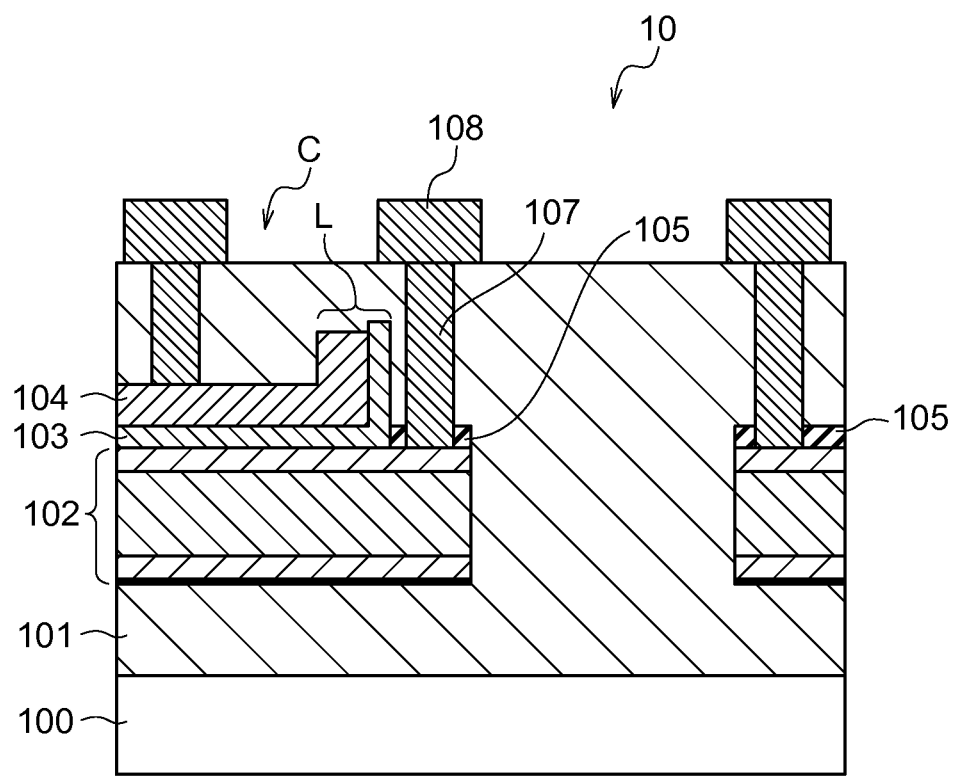
FIG. 1 is a longitudinal sectional view showing an example of the schematic configuration of a semiconductor device pertaining to a first embodiment.

FIG. 1 shows the schematic configuration of a semiconductor device 10 pertaining to the present embodiment. FIGS. 2A to 2J schematically show main processes in a method of fabricating the semiconductor device 10 pertaining to the present embodiment. In the semiconductor device 10 pertaining to the present embodiment, there are cases where other elements, such as active elements like transistors and passive elements like resistors, are also formed together with the MIM capacitor, but in the drawings referred to below, illustration of other elements is omitted and just the area around the MIM capacitor is illustrated. Furthermore, that a given layer in the present embodiment is formed "on another layer" or "on the substrate" is not limited to a case where the given layer is directly formed on the other layer or on the substrate and also includes a case where the given layer is formed via a third layer.

As shown in FIG. 1, the semiconductor device 10 is configured to include a semiconductor substrate 100, an interlayer insulating film 101, a lower electrode 102, an insulating film 105, an insulating film 103, an upper electrode 104, plugs 107, and upper wires 108.

A MIM capacitor C pertaining to the present embodiment is configured mainly by the lower electrode 102, the insulating film 103, and the upper electrode 104, and the insulating film 103 serves as a capacitor insulating film in the MIM capacitor C (a dielectric layer of the capacitor). Furthermore, in the present embodiment, a SiN film is employed as the insulating film 103, and the film thickness of the insulating film 103 is decided in accordance with, for example, the capacitance of the MIM capacitor C.

Moreover, the end portion of the insulating film 103 and the upper electrode 104 of the MIM capacitor C pertaining to the present embodiment is thick compared to the region outside the end portion and is formed thicker than the insulating film 105. In other words, the insulating film 103 and the upper electrode 104 have an L-shaped portion that is bent toward the surface side (the side opposite the side where the semiconductor substrate 100 is disposed) of the semiconductor device 10.

Next, the method of fabricating the semiconductor device 10 will be described with reference to FIGS. 2A to 2J.

When forming the MIM capacitor C pertaining to the present embodiment, first the interlayer insulating film 101 is formed on the semiconductor substrate 100. In the present embodiment, a silicon substrate is employed as the semiconductor substrate 100 and a SiO$_2$ film is employed as the interlayer insulating film 101. The interlayer insulating film 101 is not essential and the MIM capacitor C may also be formed directly on the semiconductor substrate 100.

Figure 2A:
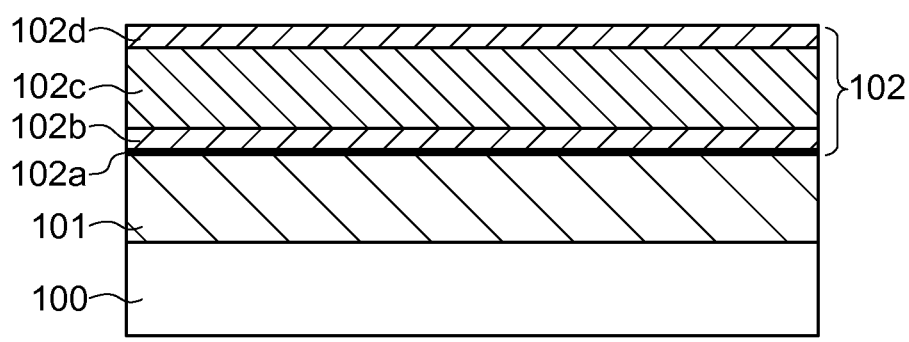
FIGS. 2A to 2J are parts of longitudinal sectional views provided for describing an example of steps for fabricating the semiconductor device pertaining to the first embodiment.

Next, as shown in FIG. 2A, the lower electrode 102 is formed on the interlayer insulating film 101. The lower electrode 102 is a multilayer film comprising an Al and Ti compound, such as a Ti/TiN/Al/Ti film, for example, and is formed using sputtering, for example. The Ti/TiN/Al/Ti film is a multilayer film comprising a Ti film 102a, a TiN film 102b, an Al film 102c, and a Ti film 102d that have been sequentially layered on top of one another from the bottom.

Figure 2B:
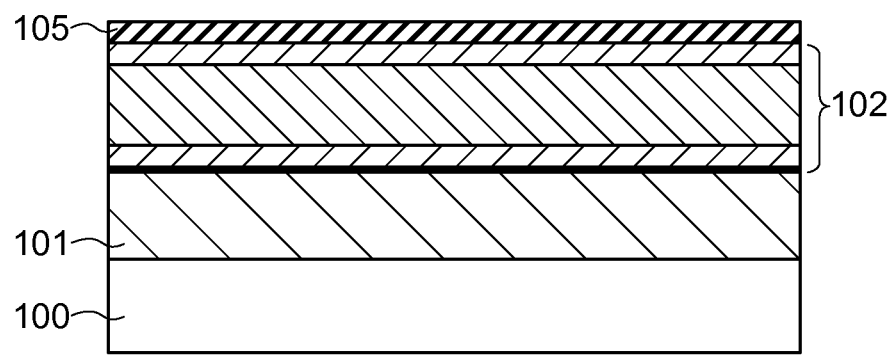

Next, as shown in FIG. 2B, the insulating film 105 is formed on the lower electrode 102. The insulating film 105 is a SiON film, for example, and the SiON film is deposited by CVD, for example.

Figure 2C:
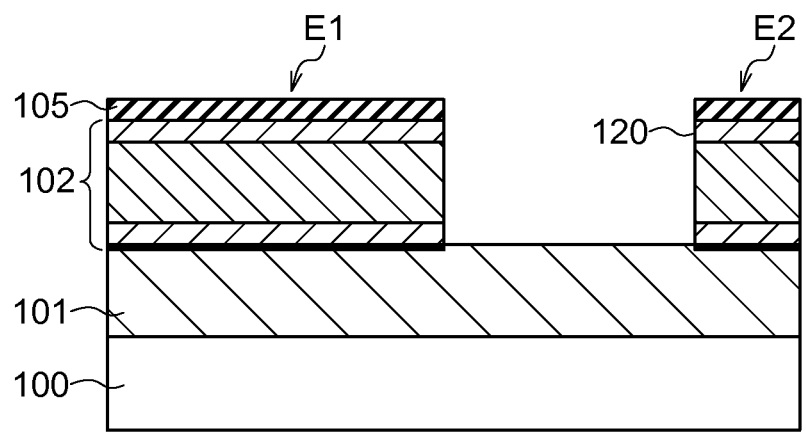

Next, as shown in FIG. 2C, the lower electrode 102 is patterned using lithography and etching to form an opening 120. The aforementioned insulating film 105 has the function of an antireflection film during this patterning. In other words, in the lithography, during exposure when patterning a resist, the insulating film 105 functions as an antireflection film that prevents the exposure light from being reflected by the lower electrode 102 and particularly the Al film 102c.

In the present embodiment, of a lower electrode E1 and a lower electrode E2 shown in FIG. 2C that have been divided by the patterning of the lower electrode 102, the lower electrode E1 becomes the lower electrode of the MIM capacitor C. The lower electrode E2 may also function as the lower electrode of another MIM capacitor C or may also be part of a lower wire.

Figure 2D:
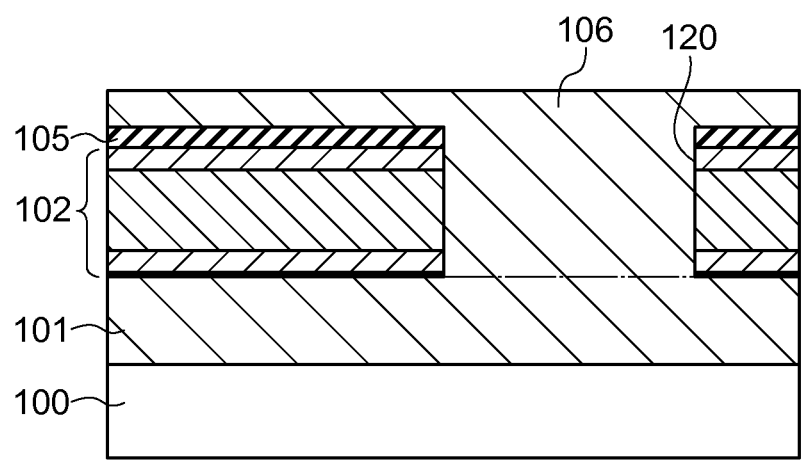

Next, as shown in FIG. 2D, an interlayer insulating film 106 is formed filling in the opening 120, and thereafter the unevenness produced by the patterning of the lower electrode 102 is planarized by chemical mechanical polishing (CMP) or etching with respect to the total surface. For the interlayer insulating film 106 pertaining to the present embodiment, a $SiO_2$ film deposited by CVD, for example, is used.

Figure 2E:
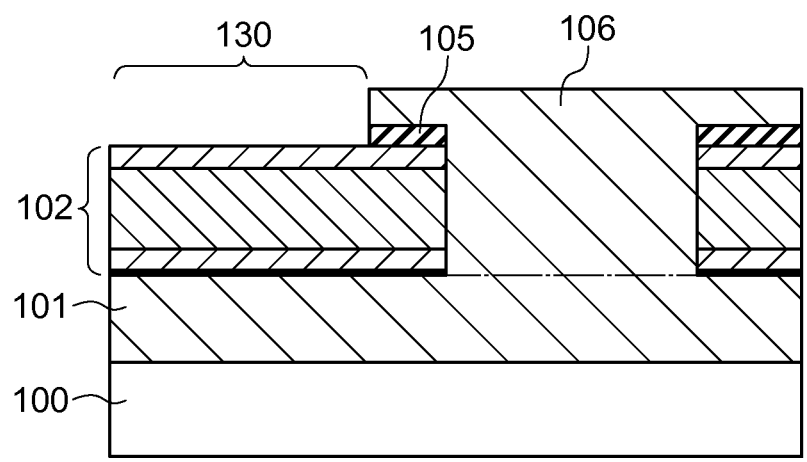

Next, as shown in FIG. 2E, part of the interlayer insulating film 106 and the insulating film 105 on the lower electrode 102 is patterned and removed using lithography and etching. In other words, part of the interlayer insulating film 106 and the insulating film 105 is removed, leaving an end portion of the interlayer insulating film 106 and the insulating film 105 on the lower electrode 102. The region from which the interlayer insulating film 106 and the insulating film 105 have been removed becomes a MIM capacitor formation region 130.

Figure 2F:
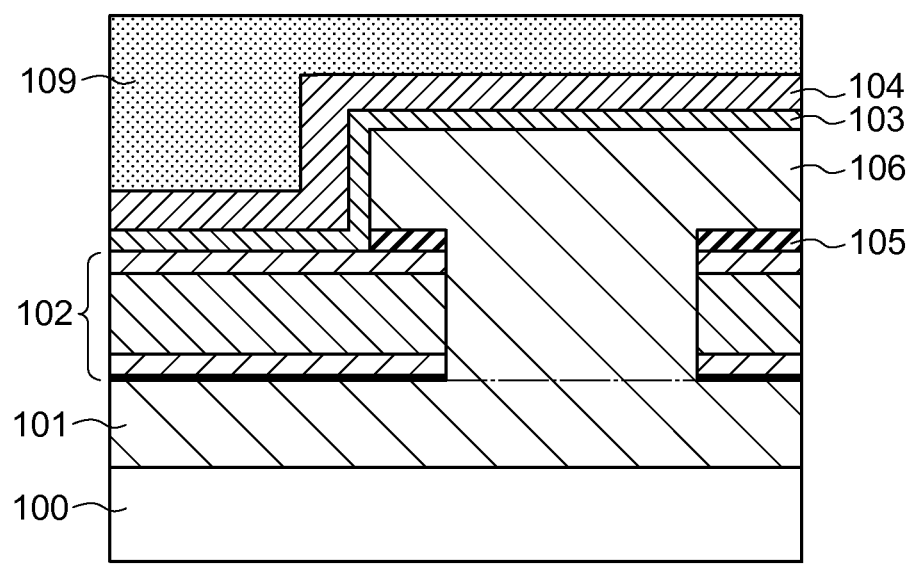

Next, as shown in FIG. 2F, the insulating film 103 is formed on the total surface of the lower electrode 102 and the interlayer insulating film 106, the upper electrode 104 is formed on the insulating film 103, and an organic sacrificial film 109 is formed on the upper electrode 104.

The insulating film 103 pertaining to the present embodiment is a SiN film, for example, and is deposited by CVD, for example. A SiN film has a higher relative permittivity than a SiON film; for example, whereas the relative permittivity of a SiON film is about 5.4, the relative permittivity of a SiN film is about 8.0. Consequently, with the MIM capacitor C of the semiconductor device 10 pertaining to the present embodiment that uses this SiN film as the capacitor insulating film, managing the film thickness of the capacitor insulating film becomes easier and it becomes possible to increase the capacitance compared to the MIM capacitor C pertaining to the related art that uses the SiON film as the capacitor insulating film. That is, whereas in the related art the patterning of the lower electrode is performed in a state in which the capacitor film and the antireflection film have been layered on top of one another, in the present embodiment the patterning of the lower electrode is performed before forming the capacitor film, so the capacitor film and the antireflection film can be managed independent of one another, and therefore managing the film thickness becomes easier. Furthermore, even with the same capacitance, the film thickness of the SiN film can be made thicker compared to the SiON film, so the breakdown voltage is also improved. The upper electrode 104 pertaining to the present embodiment is, for example, a TiN film formed using sputtering.

Figure 2G:
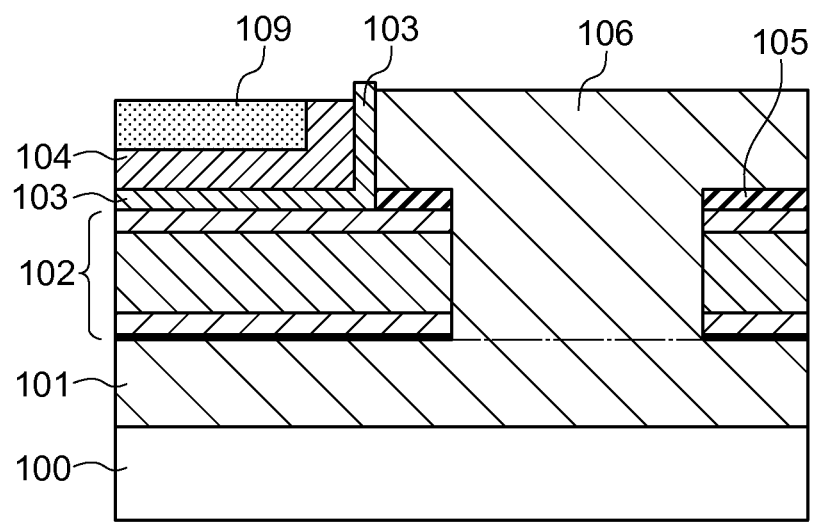

Next, as shown in FIG. 2G etching is performed with respect to the total surface to thereby remove the organic sacrificial film 109, the upper electrode 104, and the insulating film 103 outside the MIM capacitor formation region 130 and expose the interlayer insulating film 106. In other words, the step shown in FIG. 2G is a step of etching the total surface using as a mask the organic sacrificial film 109 left in the MIM capacitor formation region 130.

Figure 2H:
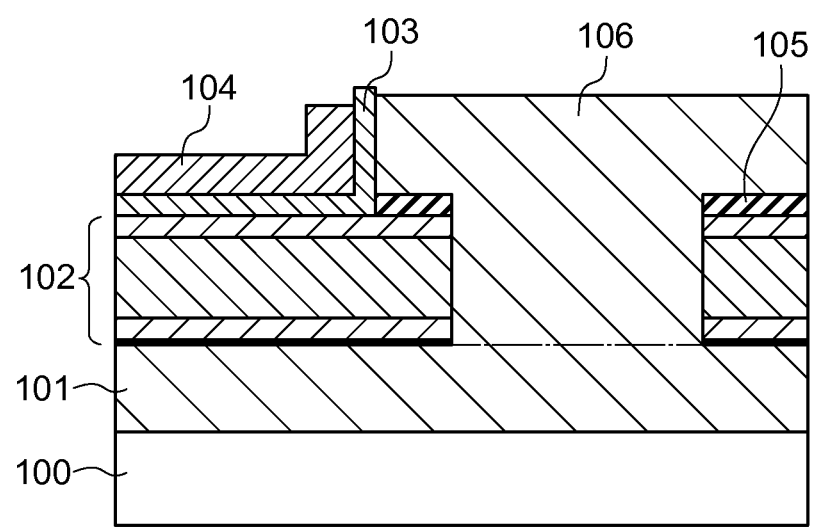

Next, as shown in FIG. 2H, the organic sacrificial film 109 left in the MIM capacitor formation region 130 is removed by ashing. Thereafter, an interlayer insulating film 111 (shown in FIG. 2I) is formed on the total surface (on the upper electrode 104, the insulating film 103, and the interlayer insulating film 106).

Figure 2I:
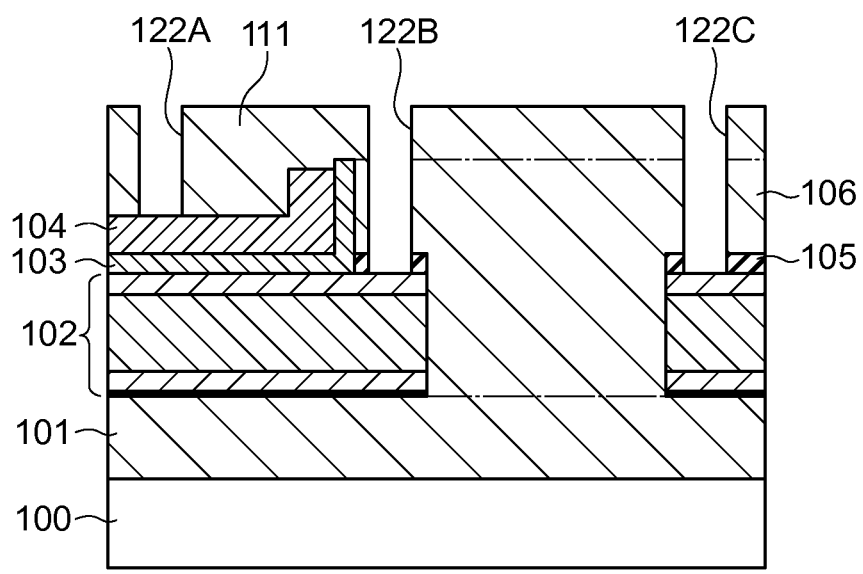

Next, as shown in FIG. 2I, vias 122A, 122B, and 122C are formed in the interlayer insulating film 106 and the interlayer insulating film 111 using lithography and etching, for example. In the example in FIG. 2I, the via 122A includes an opening that reaches the upper electrode 104, and the vias 122B and 122C include openings that reach the Ti film 102d of the lower electrode 102. At this time, the vias 122B and 122C are formed in such a way that they do not reach the Al film 102c of the lower electrode 102.

Figure 2J:
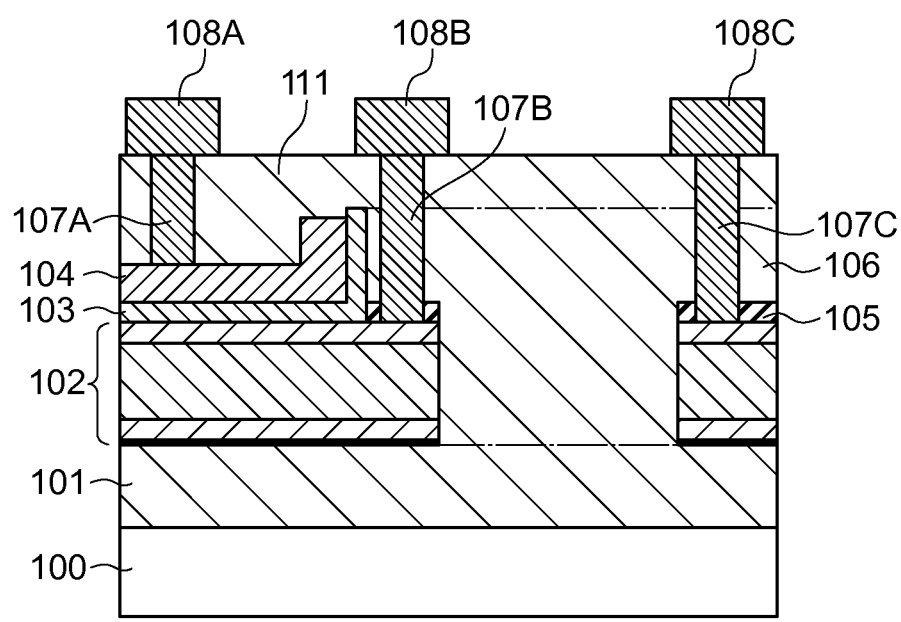

Next, as shown in FIG. 2J, the vias 122A, 122B, and 122C are plugged with plugs 107A, 107B, and 107C (hereinafter simply called "the plugs 107" when it is not necessary to distinguish between them). The plugs 107 are formed of tungsten (W), for example.

Next, as shown in FIG. 2J, upper wires 108A, 108B, and 108C (hereinafter simply called "the upper wires 108" when it is not necessary to distinguish between them) that are electrically connected to the plugs 107 are formed. The structure of the upper wires 108 may be the same structure as the structure of the lower electrode 102 (a Ti/TiN/Al/Ti multilayer structure). Furthermore, a surface protection film comprising a SiN film, for example, may also be formed on the total surface after the formation of the upper wires 108.

As described in detail above, according to the semiconductor device fabricating method and the semiconductor device pertaining to the present embodiment, the SiN film having a high relative permittivity is employed as the capacitor insulating film, so compared to the MIM capacitor pertaining to the related art that uses the SiON film as the capacitor insulating film, capacitance can be increased and managing the film thickness becomes easier.

Furthermore, by performing the patterning of the lower electrode 102 before the patterning of the upper electrode 104, it becomes possible to decide what material to use for the antireflection film regardless of the material used for the capacitor insulating film. For that reason, the antireflection film can be a single layer comprising a SiON film (the insulating film 105), for example, so patterning when forming the opening 120 can be precisely performed.

Moreover, according to the semiconductor device fabricating method and the semiconductor device pertaining to the present embodiment, it becomes difficult for an electric field concentration to occur on the lower layer side from the upper electrode 104 of the MIM capacitor C, so the breakdown voltage is improved compared to the related art.

This point will be described in greater detail with reference to FIGS. 3A and 3B and FIGS. 4A and 4B.

Figure 3A:
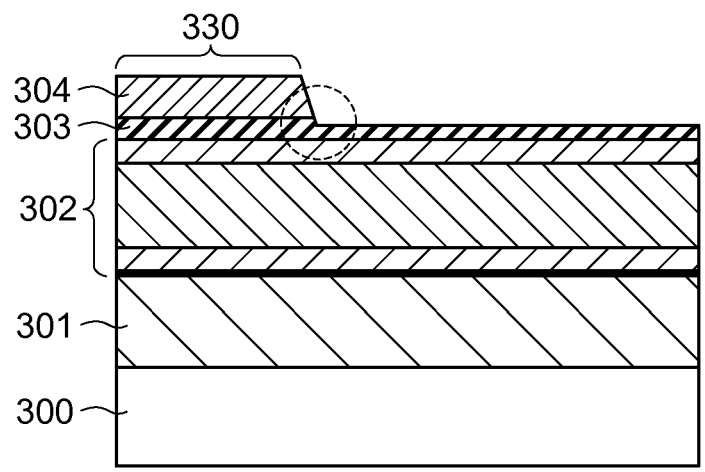
FIGS. 3A and 3B are longitudinal sectional views provided for describing the formation of an upper electrode in a semiconductor device pertaining to related art.
Figure 3B:
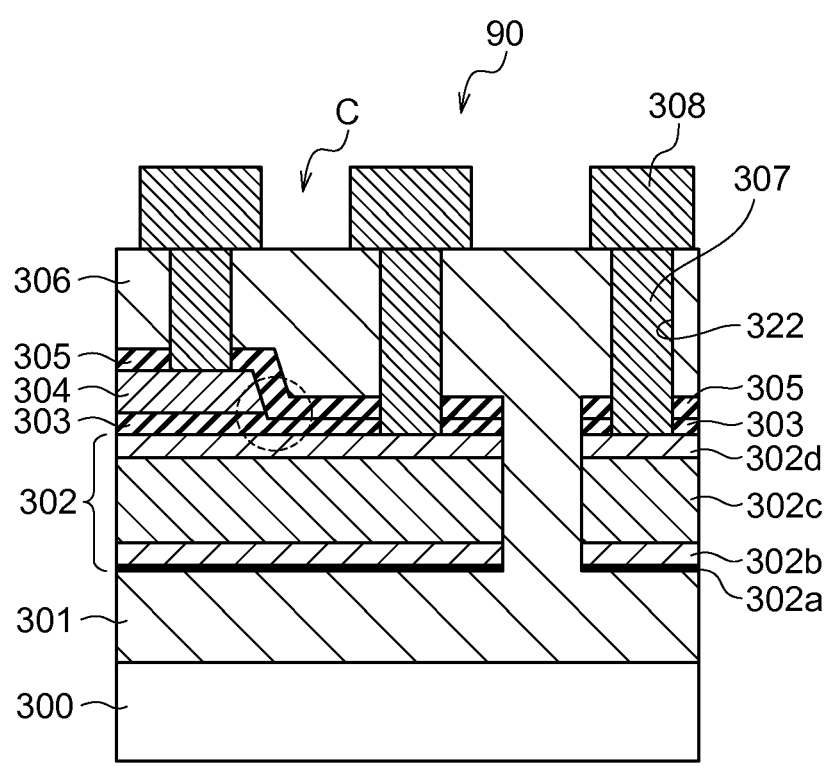
Figure 7A:
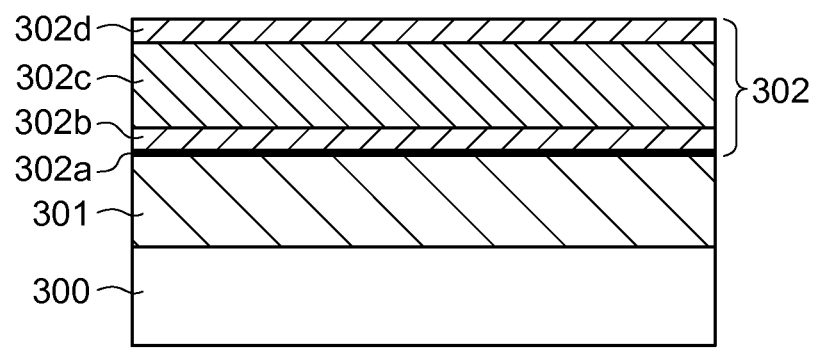
FIGS. 7A to 7E are parts of longitudinal sectional views provided for describing an example of steps for fabricating the semiconductor device pertaining to the related art.
Figure 7B:
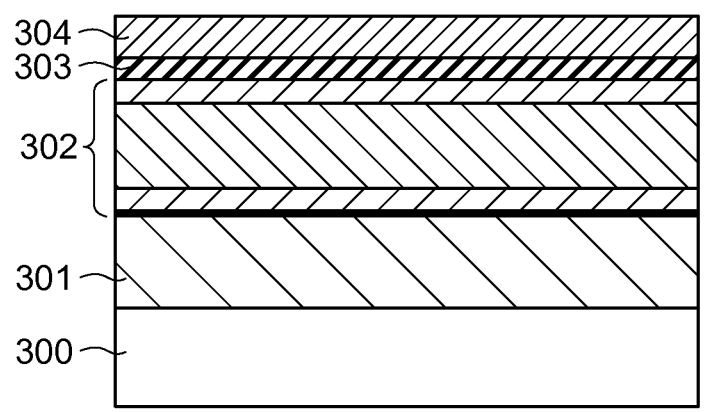
Figure 7C:
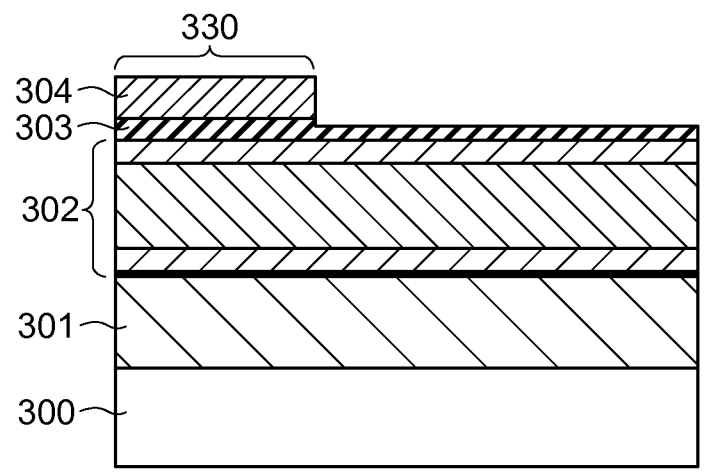
Figure 7D:
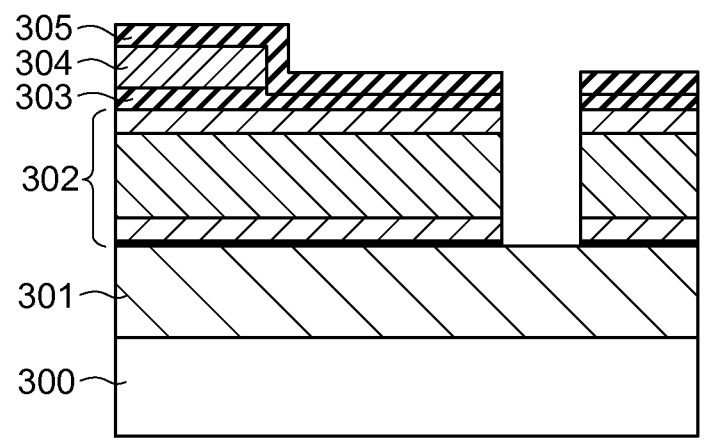
Figure 7E:
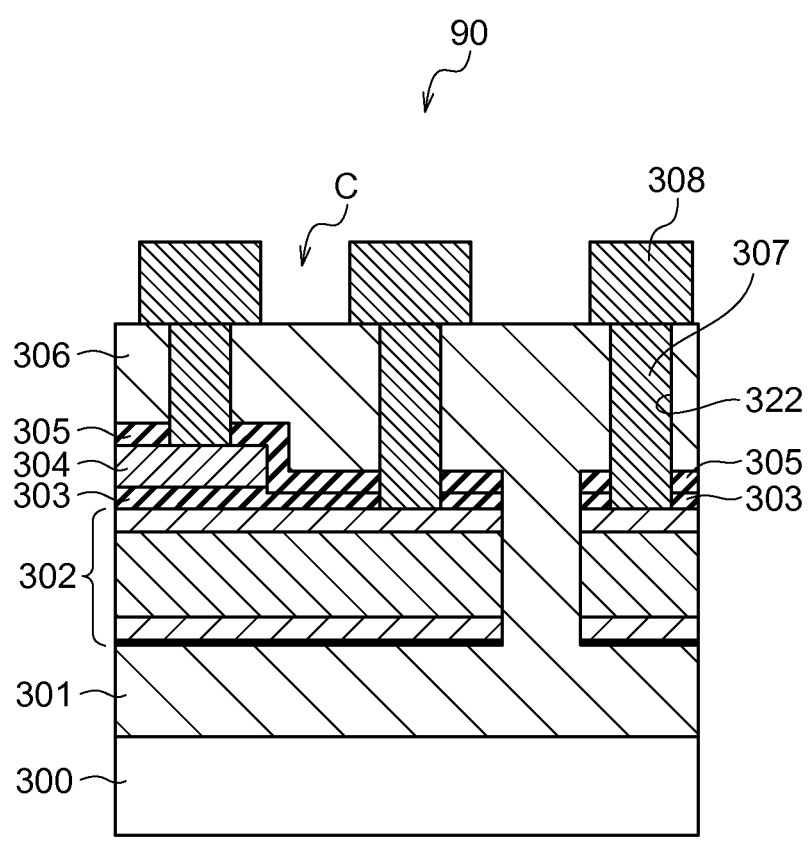

FIGS. 3A and 3B are drawings for describing electric field concentration in the upper electrode 304 of the semiconductor device 90 pertaining to the related art and correspond to FIGS. 7C and 7E, respectively.

As indicated by the dashed circle in FIG. 3A, during the dry etching of the upper electrode 304 of the semiconductor device 90 pertaining to the related art, sometimes, due to spreading of the etching gas, the upper electrode 304 is cut obliquely rather than parallel to the side surface. In the case of the semiconductor device 90 finished through this step, there is the concern that the electric field will concentrate in the corner section of the upper electrode 304 that has been cut to an acute angle indicated by the dashed circle in FIG. 3B and that the breakdown voltage will drop.

Figure 4A:
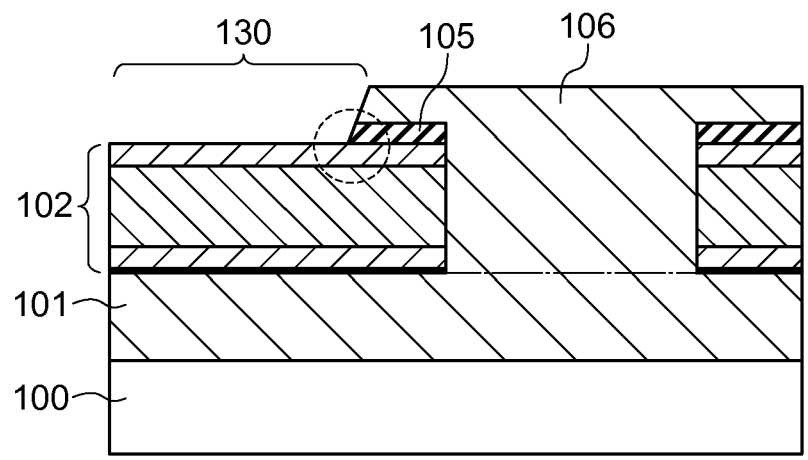
FIGS. 4A and 4B are longitudinal sectional views provided for describing the formation of an upper electrode in the semiconductor device pertaining to the first embodiment.
Figure 4B:
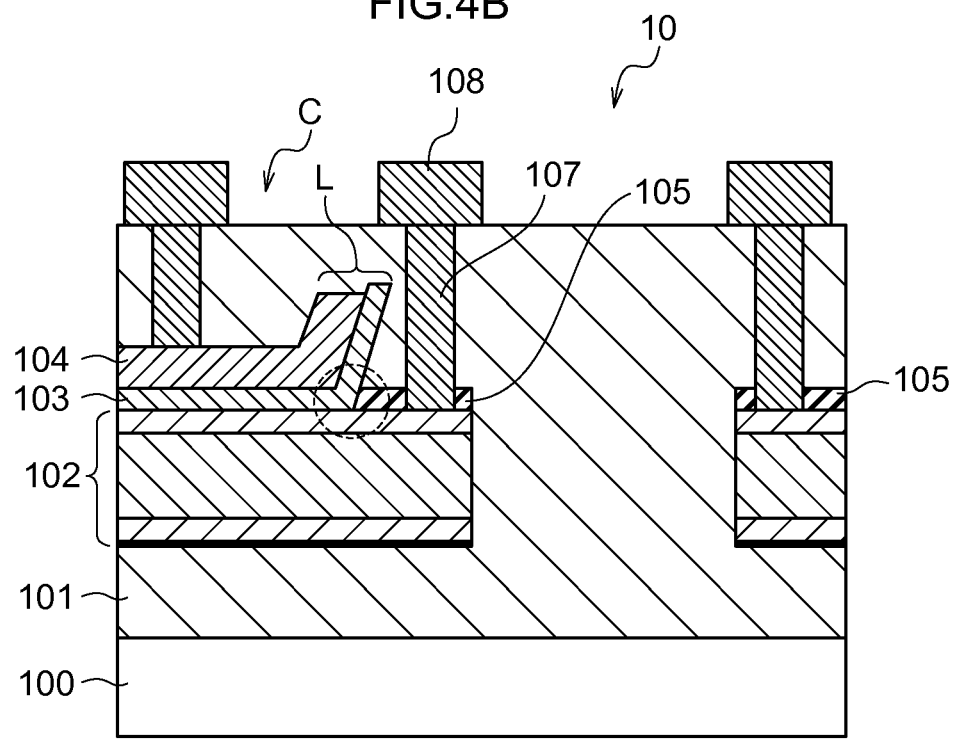

FIGS. 4A and 4B are drawings for describing the step of forming the upper electrode 104 of the semiconductor device 10 pertaining to the present embodiment and correspond to FIG. 2E and FIG. 1, respectively. In the step of forming the upper electrode 104 in the semiconductor device 10, as shown in FIG. 4A, the etching is performed with respect to the interlayer insulating film 106 and the insulating film 105 before forming the upper electrode 104. Consequently, although the interlayer insulating film 106 and the insulating film 105 are cut in a tapered shape and have an acute angle section, in the finished semiconductor device 10, as indicated in the dashed circle in FIG. 4B, the end portion (corner section) of the upper electrode 104 is formed in an obtuse angle and concentration of the electric field is mitigated. As a result, a drop in the breakdown voltage like in the semiconductor device 90 is controlled.

In the semiconductor device 10 pertaining to the present embodiment, the end portion of the upper electrode 104 may also be proactively formed in an obtuse angle by selecting the etching gas.

That is, for the etching gas in the etching, ordinarily a gas that has a stronger anisotropy (less spreading), such as a $C_4F_8$/Ar (argon)/$O_2$ gas, is used. This is replaced with a $CHF_3$/CO gas that has a weaker anisotropy (greater spreading), for example, and the etching of the interlayer insulating film 106 and the insulating film 105 is performed. By doing this, the end portion of the upper electrode 104 is precisely formed in an obtuse angle and concentration of the electric field is more reliably mitigated, so a drop in the breakdown voltage of the semiconductor device 10 is more reliably controlled.

[Second Embodiment]

A semiconductor device fabricating method and a semiconductor device pertaining to a second embodiment will now be described with reference to FIG. 5 and FIGS. 6A to 6F.

Figure 5:
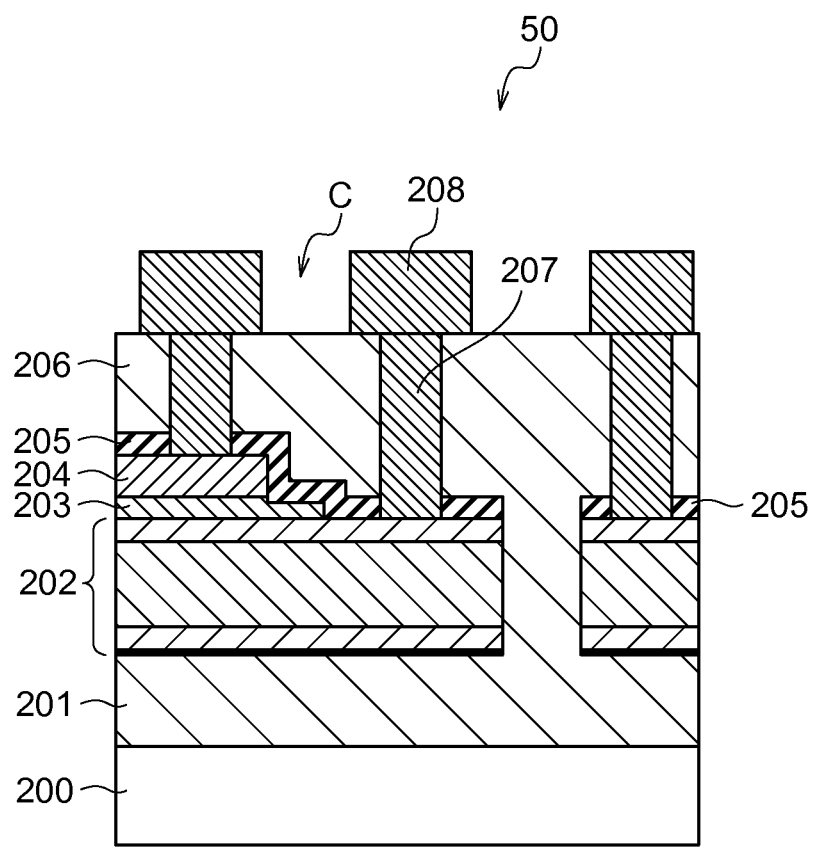
FIG. 5 is a longitudinal sectional view showing an example of the schematic configuration of a semiconductor device pertaining to a second embodiment.

FIG. 5 shows the schematic configuration of a semiconductor device 50 pertaining to the present embodiment, and FIGS. 6A to 6F schematically show main processes in a method of fabricating the semiconductor device 50 pertaining to the present embodiment.

As shown in FIG. 5, the semiconductor device 50 is configured to include a semiconductor substrate 200, an interlayer insulating film 201, a lower electrode 202, an insulating film 203, an insulating film 205, an upper electrode 204, plugs 207, and upper wires 208.

A MIM capacitor C pertaining to the present embodiment is mainly configured by the lower electrode 202, the insulating film 203, and the upper electrode 204. The insulating film 203 is a capacitor insulating film in the MIM capacitor C. In the present embodiment, a SiN film is employed as the insulating film 203. The film thickness of the insulating film 203 is decided in accordance with, for example, the capacitance of the MIM capacitor C.

Next, a method of fabricating the semiconductor device 50 will be described with reference to FIGS. 6A to 6F.

When forming the MIM capacitor C pertaining to the present embodiment, first the interlayer insulating film 201 is formed on the semiconductor substrate 200. In the present embodiment, a silicon substrate is employed as the semiconductor substrate 200 and a $SiO_2$ film is employed as the interlayer insulating film 201.

Figure 6A:
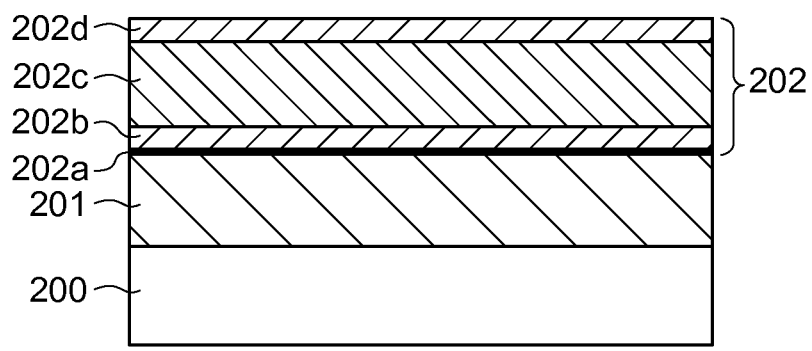
FIGS. 6A to 6F are parts of longitudinal sectional views provided for describing an example of steps for fabricating the semiconductor device pertaining to the second embodiment.

Next, as shown in FIG. 6A, the lower electrode 202 is formed on the interlayer insulating film 201 The lower electrode 202 is a multilayer film comprising an Al and Ti compound, such as a Ti/TiN/Al/Ti film, for example, and is formed using sputtering, for example. The Ti/TiN/Al/Ti film is a multilayer film comprising a Ti film 202a, a TiN film 202b, an Al film 202c, and a Ti film 202d that have been sequentially layered on top of one another from the bottom.

Figure 6B:
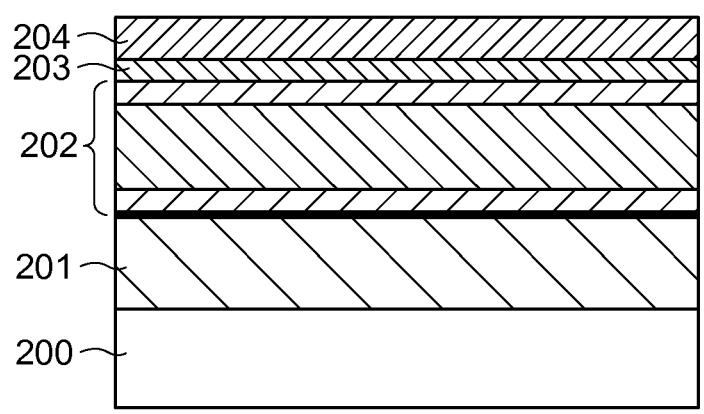

Next, as shown in FIG. 6B, the insulating film 203 is formed on the lower electrode 202, and the upper electrode 204 is formed on the insulating film 203. In the present embodiment, the insulating film 203 is a SiN film, for example, and is deposited by CVD, for example. As mentioned above, a SiN film has a higher relative permittivity than a SiON film. Consequently, the capacitance of the MIM capacitor C pertaining to the present embodiment that uses the SiN film as the capacitor insulating film can be increased over that of the MIM capacitor pertaining to the related art that uses the SiON film. Furthermore, even with the same capacitance, the film thickness of the SiN film can be made thicker compared to the SiON film, so the breakdown voltage is also improved. The upper electrode 204 pertaining to the present embodiment is, for example, a TiN film formed using sputtering.

Figure 6C:
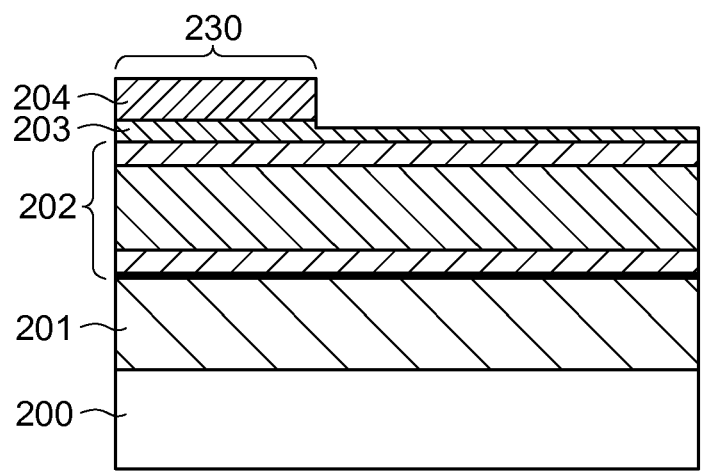

Next, as shown in FIG. 6C, the upper electrode 204 is patterned using lithography and etching to form a MIM capacitor formation region 230. At this time, the insulating film 203 is also left on the section outside the MIM capacitor formation region 230 to prevent reaction products that occur during the etching from sticking to the side wall section of the MIM capacitor C and leading to a poor breakdown voltage.

Figure 6D:
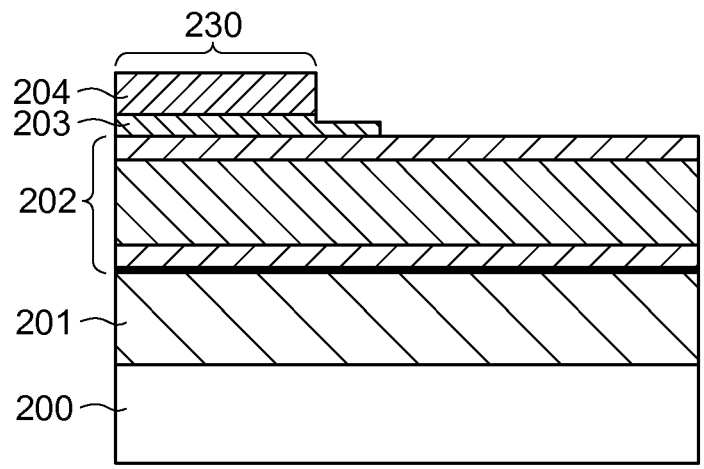

Next, as shown in FIG. 6D, part of the insulating film 203 in the region outside in the MIM capacitor formation region 230 is patterned and removed using lithography and etching. At this time, the insulating film 203 is patterned in such a way that the outer periphery of the insulating film 203 becomes sufficiently wider than the outer periphery of the MIM capacitor formation region 230, or in other words so that the insulating film 203 sufficiently widely covers the MIM capacitor formation region 230. By doing this, reaction products that react in the etching of the insulating film 203 can be kept from sticking to the upper electrode 204 and lowering the breakdown voltage.

Next, the insulating film 205 (shown in FIG. 6E) is formed on the total surface (on the upper electrode 204, the insulating film 203, and the lower electrode 202). In the present embodiment, a SiON is employed as an example of the insulating film 205.

Figure 6E:
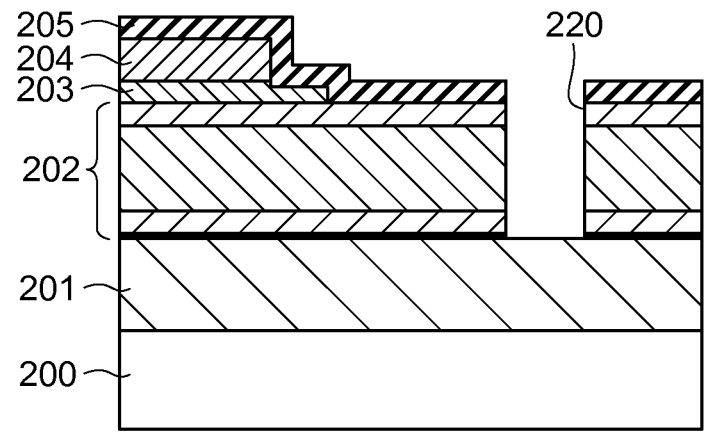

Next, as shown in FIG. 6E, an opening 220 is formed using lithography and etching to pattern the lower electrode 202. The antireflection film in this lithography becomes the single layer of the SiON film serving as the insulating film 205, so managing the film thickness is easy compared to the related art. Furthermore, because the SiON is not cut by etching, film thickness variations can be controlled and lithography finishing variations can be significantly reduced.

Figure 6F:
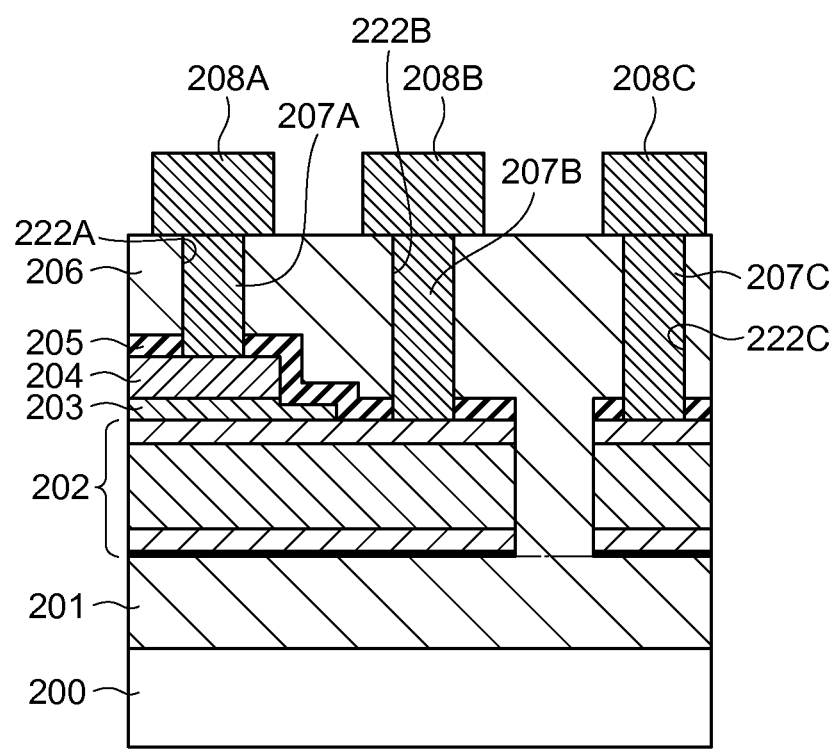

Next, an interlayer insulating film 206 is formed. Thereafter, as shown in FIG. 6F, vias 222A, 222B, and 222C are formed in the interlayer insulating film 206 using lithography and etching. In the example in FIG. 6F, the via 222A includes an opening that reaches the upper electrode 204, and the vias 222B and 222C include openings that reach the Ti film 202d of the lower electrode 202. At this time, the vias 222B and 222C are formed in such a way that they do not reach the Al film 202c of the lower electrode 202.

Next, as shown in FIG. 6F, the vias 222A, 222B, and 222C are plugged with plugs 207A, 207B, and 207C (hereinafter simply called "the plugs 207" when it is not necessary to distinguish between them). The plugs 207 are formed of tungsten (W), for example.

Next, as shown in FIG. 6F, upper wires 208A, 208B, and 208C (hereinafter simply called "the upper wires 208" when it is not necessary to distinguish between them) that are electrically connected to the plugs 207 are formed. The structure of the upper wires 208 may be the same structure as the structure of the lower electrode 202 (i.e., a Ti/TiN/Al/Ti multilayer structure).

As described in detail above, according to the semiconductor device fabricating method and the semiconductor device pertaining to the present embodiment, the SiN film having a high relative permittivity is employed as the capacitor insulating film, so compared to the MIM capacitor pertaining to the related art that uses the SiON film as the capacitor insulating film, it becomes possible to increase capacitance and control a degradation of the breakdown voltage.

Furthermore, the insulating film 205 that is the antireflection film used during the patterning of the lower electrode 202 comprises the single layer of the SiON film, and the SiON film is not cut during the fabricating process. As a result, managing the film thickness of the insulating film 205 becomes easy, so variations in the film thickness of the insulating film 205 become significantly lesser in extent than heretofore. As a result, variations in the lithography become lesser in extent and high-precision wire patterning becomes possible.

What is claimed is:

1. A method of fabricating a semiconductor device, the method comprising:
   forming a lower electrode layer on a substrate;
   forming a first insulating film on the lower electrode layer and forming an upper electrode on the first insulating film;
   removing a part of the first insulating film at a region other than the upper electrode;
   forming a second insulating film on the lower electrode, the first insulating film and the upper electrode, after said removing the part of the first insulating film;
   forming an opening in the second insulating film and patterning the lower electrode layer to form a lower electrode;
   forming a third insulating film on the second insulating film and in the opening in the second insulating film;
   removing a first part of the third insulating film by patterning to form a first open portion that exposes the upper electrode,
   removing a second part of the third insulating film and a part of the second insulating film by patterning to form a second open portion that exposes the lower electrode, and
   forming in the first open portion a first conductive portion that is electrically connected to the upper electrode and forming in the second open portion a second conductive portion that is electrically connected to the lower electrode.

2. The method of claim 1, wherein the second insulating film comprises an antireflection film.

3. The method of claim 1, wherein the second insulating film comprises a silicon oxynitride film.

4. The method of claim 1, wherein said removing the part of the first insulating film comprises selectively etching the first insulating film.

5. The method of claim 1, wherein forming the upper electrode comprises forming an upper metal layer on the first insulating film, selectively forming a mask on the upper metal layer, and using the mask to pattern the upper metal layer and the first insulating film.

6. The method of claim 1, wherein the first insulating film comprises a silicon nitride film.

* * * * *